(12) United States Patent
Onogi et al.

(10) Patent No.: US 10,802,353 B2
(45) Date of Patent: *Oct. 13, 2020

(54) LIQUID CRYSTAL DISPLAY DEVICE

(71) Applicant: Japan Display Inc., Tokyo (JP)

(72) Inventors: Tomohide Onogi, Azumino (JP); Yasuo Segawa, Azumino (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/163,794

(22) Filed: Oct. 18, 2018

(65) Prior Publication Data

US 2019/0049800 A1 Feb. 14, 2019

Related U.S. Application Data

(63) Continuation of application No. 15/134,677, filed on Apr. 21, 2016, now Pat. No. 10,126,608, which is a
(Continued)

(30) Foreign Application Priority Data

Jul. 27, 2006 (JP) .................................. 2006-204624

(51) Int. Cl.
*G02F 1/1343* (2006.01)
*G02F 1/1362* (2006.01)
(Continued)

(52) U.S. Cl.
CPC ...... *G02F 1/134336* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

| 5,831,709 A | 11/1998 | Song |
| 5,852,485 A | 12/1998 | Shimada et al. |

(Continued)

FOREIGN PATENT DOCUMENTS

| JP | 9-160075 | 6/1997 |
| JP | 9-230380 | 9/1997 |

(Continued)

OTHER PUBLICATIONS

U.S. Patent and Trademark Office, Non-Final Office Action issued in connection with U.S. Appl. No. 13/493,618, dated Feb. 13, 2015. (18 pages).

(Continued)

*Primary Examiner* — Dorothy Harris
(74) *Attorney, Agent, or Firm* — K&L Gates LLP

(57) ABSTRACT

A liquid crystal display device according to FFS technology is provided, which sufficiently provides a common electrode with common electric potential and improves an aperture ratio of pixels. A pixel electrode is formed of a first layer transparent electrode. A common electrode made of a second layer transparent electrode is formed above the pixel electrode interposing an insulation film between them. The common electrode in an upper layer is provided with a plurality of slits. The common electrode extends over all the pixels in a display region. An end of the common electrode is disposed on a periphery of the display region and connected with a peripheral common electric potential line that provides a common electric potential Vcom. There is provided neither an auxiliary common electrode line nor a pad electrode, both of which are provided in a liquid crystal display device according to a conventional art.

20 Claims, 11 Drawing Sheets

Related U.S. Application Data continuation of application No. 11/878,579, filed on Jul. 25, 2007, now abandoned.

(51) Int. Cl.
| | | |
|---|---|---|
| *G02F 1/1333* | (2006.01) | |
| *G02F 1/1368* | (2006.01) | |
| *H01L 27/12* | (2006.01) | |
| *H01L 29/786* | (2006.01) | |

(52) U.S. Cl.
CPC .. *G02F 1/133345* (2013.01); *G02F 1/134363* (2013.01); *G02F 1/136227* (2013.01); *G02F 1/136286* (2013.01); *H01L 27/1222* (2013.01); *H01L 27/1244* (2013.01); *H01L 29/78669* (2013.01); *H01L 29/78678* (2013.01); *G02F 2001/133357* (2013.01); *G02F 2001/134372* (2013.01); *G02F 2001/136295* (2013.01); *G02F 2201/121* (2013.01); *G02F 2201/123* (2013.01); *G02F 2201/40* (2013.01); *G02F 2202/103* (2013.01); *G02F 2202/104* (2013.01)

(56) References Cited

U.S. PATENT DOCUMENTS

| | | | |
|---|---|---|---|
| 5,929,958 A * | 7/1999 | Ohta | G02F 1/133512 349/141 |
| 5,978,059 A * | 11/1999 | Ohta | G02F 1/133512 349/110 |
| 6,091,473 A | 7/2000 | Hebiguchi | |
| 6,262,702 B1 * | 7/2001 | Murade | G02F 1/1345 345/100 |
| 6,335,720 B1 | 1/2002 | Mori et al. | |
| 6,456,350 B1 * | 9/2002 | Ashizawa | G02F 1/134363 349/141 |
| 6,469,765 B1 | 10/2002 | Matsuyama et al. | |
| 6,483,565 B1 * | 11/2002 | Hidehira | G02F 1/134363 345/87 |
| 6,531,815 B1 * | 3/2003 | Okuyama | H01L 27/3276 313/498 |
| 6,784,966 B2 | 8/2004 | Maeda et al. | |
| 6,801,288 B1 | 10/2004 | Ashizawa et al. | |
| 6,927,824 B1 | 8/2005 | Takeda et al. | |
| 6,950,165 B2 | 9/2005 | Matsumoto et al. | |
| 7,023,517 B2 | 4/2006 | Song et al. | |
| 7,145,619 B2 | 12/2006 | Sawasaki et al. | |
| 7,196,760 B2 | 3/2007 | Maeda et al. | |
| 7,206,050 B2 | 4/2007 | Chae | |
| 7,251,008 B2 | 7/2007 | Maeda et al. | |
| 8,395,744 B2 | 3/2013 | Yoshida | |
| 8,704,991 B2 * | 4/2014 | Chang | G02F 1/1345 349/149 |
| 9,291,863 B2 * | 3/2016 | Onogi | G02F 1/134363 |
| 9,946,125 B2 * | 4/2018 | Onogi | G02F 1/134363 |
| 10,126,608 B2 * | 11/2018 | Onogi | G02F 1/134363 |
| 10,126,609 B2 * | 11/2018 | Onogi | G02F 1/134363 |
| 2001/0012084 A1 * | 8/2001 | Ohta | G02F 1/134363 349/141 |
| 2001/0026331 A1 | 10/2001 | Oota et al. | |
| 2001/0036680 A1 * | 11/2001 | Higashi | G02F 1/13458 438/30 |
| 2001/0040661 A1 | 11/2001 | Ohta et al. | |
| 2002/0008794 A1 | 1/2002 | Song et al. | |
| 2002/0027538 A1 | 3/2002 | Shimizu et al. | |
| 2002/0047971 A1 | 4/2002 | Kwon et al. | |
| 2002/0075422 A1 * | 6/2002 | Kimura | G02F 1/133377 349/43 |
| 2003/0122989 A1 * | 7/2003 | Park | G02F 1/133351 349/43 |
| 2003/0214500 A1 | 11/2003 | Ishii et al. | |
| 2004/0036826 A1 | 2/2004 | Maeda et al. | |
| 2004/0100431 A1 | 5/2004 | Yoshida et al. | |
| 2004/0108977 A1 * | 6/2004 | Hirayama | G09G 3/20 345/76 |
| 2004/0114082 A1 * | 6/2004 | Lee | G02F 1/134363 349/141 |
| 2004/0263750 A1 | 12/2004 | Chae | |
| 2005/0018121 A1 | 1/2005 | Jen et al. | |
| 2005/0139837 A1 | 6/2005 | Lee et al. | |
| 2005/0140836 A1 | 6/2005 | Choi | |
| 2005/0211986 A1 | 9/2005 | Konno et al. | |
| 2005/0225708 A1 | 10/2005 | Oke | |
| 2005/0248715 A1 | 11/2005 | Byun et al. | |
| 2006/0017865 A1 | 1/2006 | Tsubata et al. | |
| 2006/0061268 A1 * | 3/2006 | Nakanishi | H01L 27/3276 313/506 |
| 2006/0123293 A1 | 6/2006 | Kim | |
| 2006/0231846 A1 | 10/2006 | Hong et al. | |
| 2006/0244741 A1 * | 11/2006 | Kimura | G02F 1/13452 345/204 |
| 2007/0018926 A1 | 1/2007 | Shin et al. | |
| 2007/0120779 A1 | 5/2007 | Nakamura et al. | |
| 2007/0139600 A1 | 6/2007 | Lee | |
| 2007/0152943 A1 | 7/2007 | Hwang et al. | |
| 2007/0206144 A1 | 9/2007 | Maeda et al. | |
| 2008/0024416 A1 | 1/2008 | Onogi et al. | |
| 2009/0079889 A1 | 3/2009 | Komeno et al. | |
| 2009/0102826 A1 | 4/2009 | Oke et al. | |
| 2009/0310078 A1 | 12/2009 | Konno et al. | |
| 2017/0146873 A1 | 5/2017 | Onogi | |

FOREIGN PATENT DOCUMENTS

| | | |
|---|---|---|
| JP | 10-133234 | 5/1998 |
| JP | 10-186351 | 7/1998 |
| JP | 10-319436 | 12/1998 |
| JP | 11-125835 | 5/1999 |
| JP | 2001-183685 | 7/2001 |
| JP | 2001-330844 | 11/2001 |
| JP | 2002-296611 | 10/2002 |
| JP | 2002-311405 | 10/2002 |
| JP | 2003-43948 | 2/2003 |
| JP | 2003-090994 | 3/2003 |
| JP | 2003-131248 | 5/2003 |
| JP | 2005-070541 | 3/2005 |
| JP | 2005-275054 | 10/2005 |
| KR | 2001-0039664 | 5/2001 |
| KR | 10-2003-0078795 | 10/2003 |
| KR | 10-2005-0001954 | 1/2005 |
| KR | 10-2005-0058105 | 6/2005 |
| KR | 10-2005-0067735 | 7/2005 |
| KR | 10-2005-0070709 | 7/2005 |
| KR | 10-2006-0027623 | 3/2006 |
| KR | 10-2006-0098536 | 9/2006 |

OTHER PUBLICATIONS

U.S. Patent and Trademark Office,Final Office Action issued in connection with U.S. Appl. No. 13/493,618, dated Sep. 30, 2013 (9 pages).
Office Action dated Nov. 25, 2015 in corresponding U.S. Appl. No. 11/878,579.
Final Rejection issued in connection with U.S. Appl. No. 11/878,579, dated Jun. 27, 2014 (14 pages).
Non-final Rejection issued in connection with U.S. Appl. No. 11/878,579, dated Jan. 17, 2014 (9 pages).
Final Office Action issued in connection with U.S. Appl. No. 11/878,579, dated Oct. 26, 2012 (10 pages).
Non-Final Office Action issued in connection with U.S. Appl. No. 11/878,579, dated May 18, 2012 (9 pages).
Non-Final Office Action issued in connection with U.S. Appl. No. 11/878,579, dated Oct. 26, 2011 (8 pages).
Non-Final Office Action issued in connection with U.S. Appl. No. 11/878,579, dated May 4, 2011 (8 pages).
Non-Final Office Action issued in connection with U.S. Appl. No. 11/878,579, dated Dec. 10, 2010 (7 pages).
Office Action dated Jul. 3, 2017 in U.S. Appl. No. 15/162,110.
Office Action dated Oct. 13, 2017 in corresponding U.S. Appl. No. 15/423,209.

(56) References Cited

OTHER PUBLICATIONS

U.S. Office Action dated Feb. 14, 2018 in corresponding U.S. Appl. No. 15/423,209.
Non-Final Office Action issued in related U.S. Appl. No. 16/521,247 dated Aug. 21, 2019. 14 pages.

* cited by examiner

LIQUID CRYSTAL DISPLAY DEVICE

CROSS REFERENCES TO RELATED APPLICATIONS

The present application is a continuation application of U.S. patent application Ser. No. 15/134,677, filed on Apr. 21, 2016, which application is a continuation application of U.S. patent application Ser. No. 11/878,579, filed on Jul. 25, 2007, which application claims priority to Japanese Priority Patent Application JP 2006-204624 filed in the Japan Patent Office on Jul. 27, 2006, the entire content of which is hereby incorporated by reference.

BACKGROUND

This invention relates to a liquid crystal display device, specifically to a liquid crystal display device in which an alignment direction of liquid crystal molecules is controlled by a lateral electric field generated between a pixel electrode and a common electrode.

As a way to achieve a wide viewing angle of the liquid crystal display device, a method has been developed to realize a light switching function by rotating the liquid crystal molecules in a plane parallel to a substrate with a lateral electric field generated between the electrodes on the same substrate. In-Plane Switching (hereafter referred to as IPS) technology and Fringe-Field Switching (hereafter referred to as FFS) technology, which is an improved IPS technology, are known as examples of these technologies.

A manufacturing process of the liquid crystal display device according to the FFS technology will be explained referring to the drawings. FIGS. 18A through 20B show the manufacturing process of one pixel in the liquid crystal display device according to the FFS technology. FIGS. 18A, 19A and 20A are plan views of a part of a display region in the liquid crystal display device. Each of FIGS. 18B, 19B and 20B is a cross-sectional view showing a section A-A in each of FIGS. 18A, 19A and 20A, respectively. Although a large number of pixels are disposed in a matrix form in the display region in the actual liquid crystal display device, only three pixels are shown in each of the plan views.

A buffer layer 11, which is made of a silicon dioxide ($SiO_2$) film or a silicon nitride (SiNx) film, and an amorphous silicon layer are successively formed by CVD (Chemical Vapor Deposition) on a TFT substrate 10, which is made of a glass substrate or the like, as shown in FIG. 18B. The amorphous silicon layer is crystallized and transformed into a polysilicon layer by excimer laser annealing. The polysilicon layer is patterned to form a U-shaped active layer 12 of a thin film transistor 1 (hereafter referred to as TFT 1).

After that, a gate insulation film 13 is formed to cover the active layer 12. A gate line 14 made of chromium, molybdenum or the like is formed on the gate insulation film 13 overlapping the active layer 12. The gate line 14 extends in a row direction, and intersects the active layer 12 at two locations. A gate signal that controls turning on/off of the TFT 1 is applied to the gate line 14. On the other hand, an auxiliary common electrode line 15, that is made of the same material as the gate line 14 and is for providing a common electric potential Vcom, is formed parallel to the gate line 14.

Next, there is formed an interlayer insulation film 16 that covers the TFT 1 and the auxiliary common electrode line 15. And contact holes CH1 and CH2, which expose a source region 12s and a drain region 12d in the active layer 12, respectively, are formed in the interlayer insulation film 16. Also, a contact hole CH3, that exposes the auxiliary common electrode line 15, is formed in the interlayer insulation film 16.

There are formed a source electrode 17 that is connected with the source region 12s through the contact hole CH1, a display signal line 18 that is connected with the drain region 12d through the contact hole CH2, and a pad electrode 19 that is connected with the auxiliary common electrode line 15 through the contact hole CH3. The source electrode 17, the display signal line 18 and the pad electrode 19 are made of metal including aluminum or aluminum alloy or the like. Next, a planarization film 20 is formed over the entire surface. Contact holes CH4 and CH5, that expose the source electrode 17 and the pad electrode 19 respectively, are formed in the planarization film 20.

And there is formed a pixel electrode 21 that is connected with the source electrode 17 through the contact hole CH4 and extends over the planarization film 20, as shown in FIGS. 19A and 19B. The pixel electrode 21 is made of a first layer transparent electrode such as ITO (Indium Tin Oxide), and is applied a display signal Vsig from the display signal line 18 through the TFT 1.

After that, an insulation film 22 is formed to cover the pixel electrode 21, as shown in FIG. 20B. A contact hole CH6, that exposes the pad electrode 19, is formed by etching the insulation film 22. A common electrode 23, that has a plurality of slits S, is formed on the pixel electrode 21 through the insulation film 22. The common electrode 23 is made of a second layer transparent electrode such as ITO, and is connected with the pad electrode 19 through the contact hole CH6.

A counter substrate 30 made of a glass substrate or the like is disposed facing the TFT substrate 10. A polarizing plate 31 is attached to the counter substrate 30. Also, a polarizing plate 32 is attached to a back surface of the TFT substrate 10. The polarizing plates 31 and 32 are disposed in a way that their polarization axes are perpendicular to each other. A liquid crystal 40 is sealed-in between the TFT substrate 10 and the counter substrate 30.

In the liquid crystal display device described above, an average alignment direction (hereafter simply referred to as "alignment direction") of major axes of the liquid crystal molecules of the liquid crystal 40 is parallel to the polarization axis of the polarizing plate 32 when a display voltage is not applied to the pixel electrode 21 (no voltage state). In this case, linearly polarized light passing through the liquid crystal 40 does not go through the polarizing plate 31 because its polarization axis is perpendicular to the polarization axis of the polarizing plate 31. That is, black is displayed.

When the display voltage is applied to the pixel electrode 21, on the other hand, there is generated a lateral electric field from the pixel electrode 21 toward the common electrode 23 through the slits S. The electric field is perpendicular to a longitudinal direction of the slits S on the plan view, and the liquid crystal molecules are rotated along a line of electric force of the electric field. At that time, the linearly polarized incident light to the liquid crystal 40 is turned into elliptically polarized light by birefringence to have a component of linearly polarized light that passes through the polarizing plate 31. In this case, white is displayed. The liquid crystal display device according to the FFS technology is disclosed in Japanese Patent Application Publication Nos. 2001-183685 and 2002-296611.

In general, when the common electrode 23 is insufficiently provided with the common electric potential Vcom because of an influence of electric resistance, the voltage applied to the liquid crystal 40 is reduced to cause degradation in quality of display such as reduced contrast. Since the common electrode 23 is formed of the transparent electrode such as ITO that has higher sheet resistivity than ordinary metal, the degradation in the quality of display is prone to be caused. This problem becomes evident particularly as a panel size of the liquid crystal display device becomes larger. Therefore, in order to provide the common electrode 23 with the common electric potential Vcom sufficiently, the auxiliary common electrode line 15 that supplies the common electric potential Vcom is disposed within the display region and the auxiliary common electrode line 15 is connected with the common electrode 23 in each of the pixels in the conventional liquid crystal display device.

When the auxiliary common electrode line 15 is disposed within the display region, however, there is a problem that its wiring portion makes a light-shielding region to reduce an aperture ratio of the pixels. This invention is directed to offer a liquid crystal display device capable of securely providing the common electrode with the common electric potential sufficiently and improving the aperture ratio of the pixels to obtain a bright display.

SUMMARY

A liquid crystal display device of this invention includes a substrate; a plurality of pixels disposed in a display region on the substrate, each of the pixels including a pixel electrode and a common electrode having a plurality of slits and disposed on the pixel electrode through an insulation film and extending over the plurality of the pixels; and a peripheral common electric potential line provided with a common electric potential and disposed on a periphery of the display region, wherein an end of the common electrode is connected with the peripheral common electric potential line.

Additional features and advantages are described herein, and will be apparent from the following Detailed Description and the figures.

DETAILED DESCRIPTION

Embodiments of the present application will be described below in detail with reference to the drawings.

Figure 1:
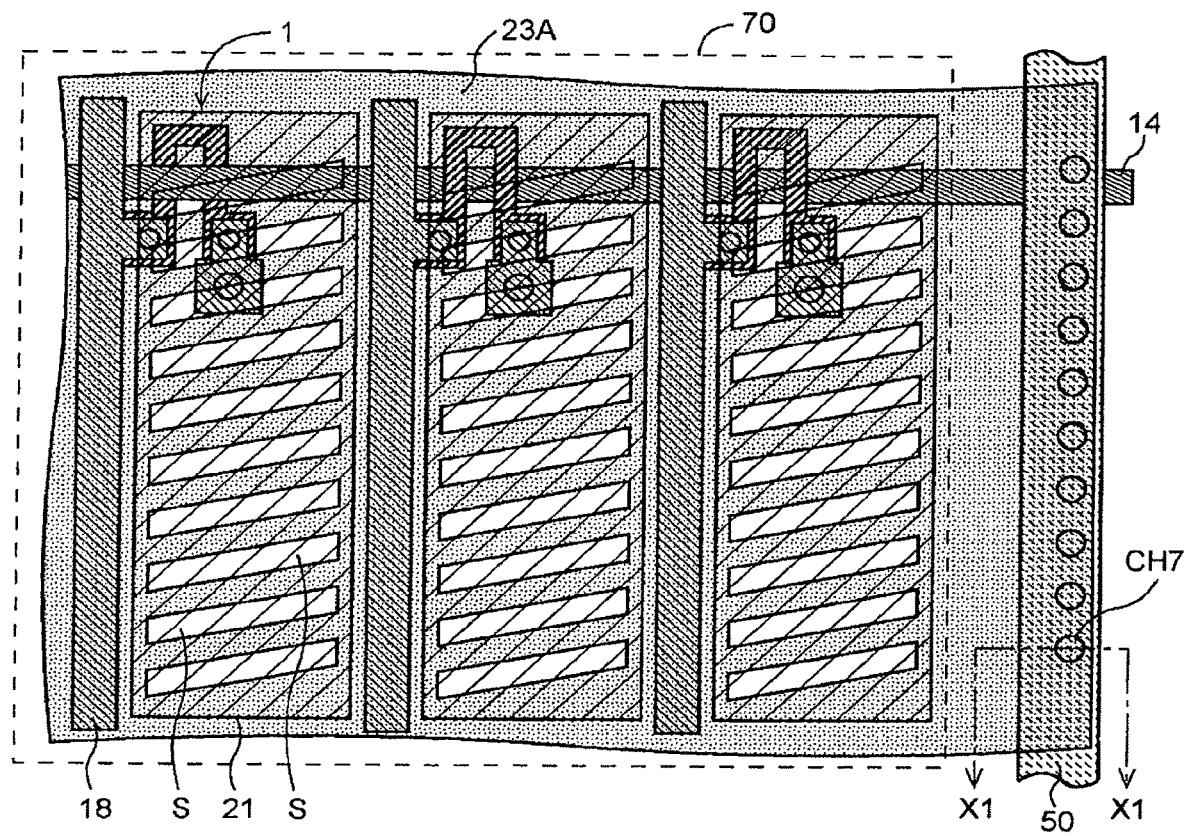
FIG. 1 is a plan view showing a portion of a display region in a liquid crystal display device according to a first embodiment of this invention.
Figure 2:
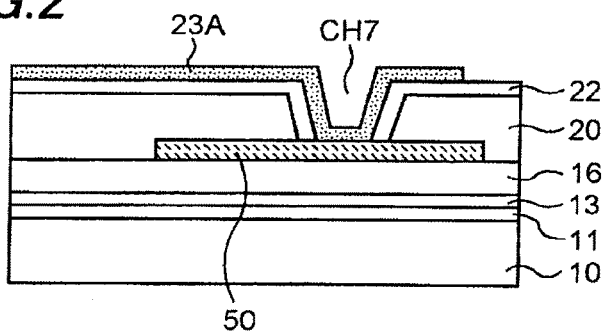
FIG. 2 is a cross-sectional view showing a section X1-X1 in FIG. 1.

A liquid crystal display device according to a first embodiment of this invention will be explained referring to the drawings. FIG. 1 is a plan view showing a portion of a display region in the liquid crystal display device. FIG. 2 is a cross-sectional view showing a section X1-X1 in FIG. 1. Although a large number of pixels are disposed in a matrix form in the display region 70 in the actual liquid crystal display device, only three pixels are shown in the plan view.

Figure 20A:
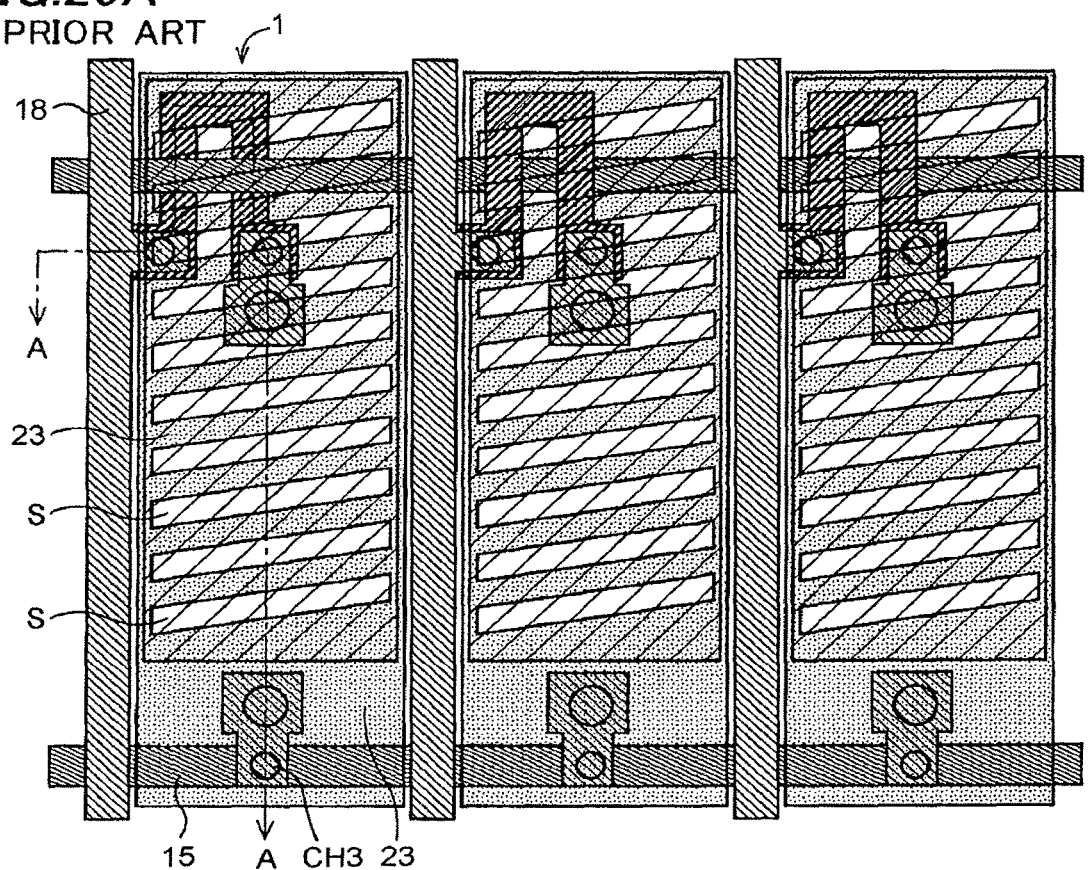
FIGS. 20A and 20B are for explanation of the structure and the manufacturing method of the liquid crystal display device according to the conventional art.
Figure 20B:
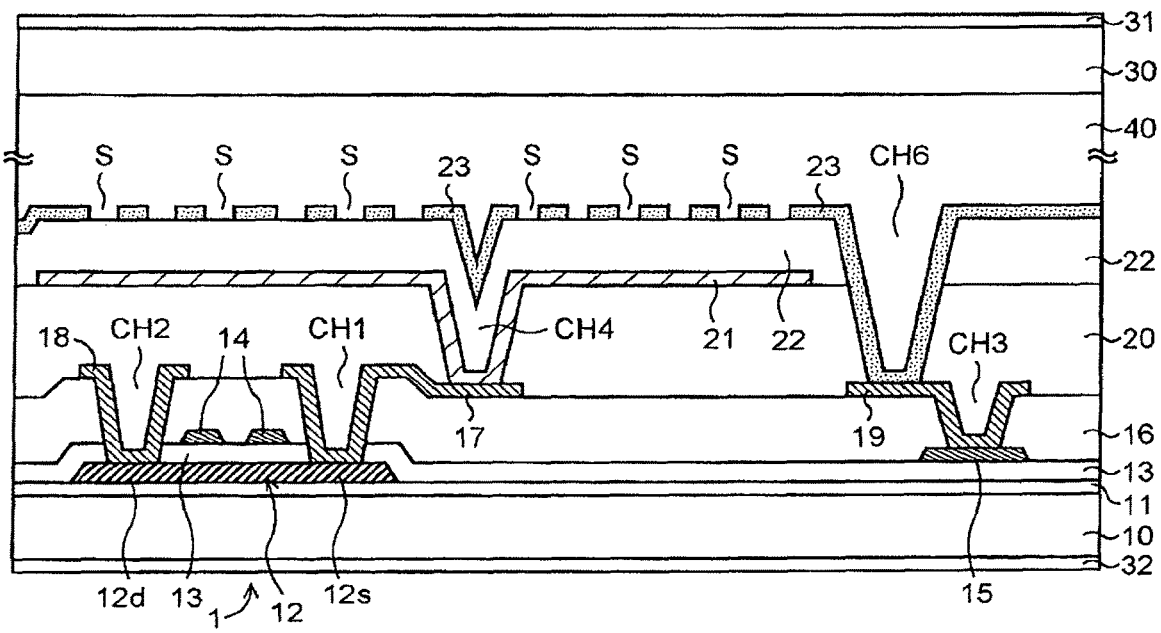

A pixel electrode 21 is formed of a first layer transparent electrode. A common electrode 23A made of a second layer transparent electrode is formed above the pixel electrode 21 interposing an insulation film 22 between them. The common electrode 23A in an upper layer is provided with a plurality of slits S. The structures described above are generally common to the structure shown in FIGS. 20A and 20B. In the embodiment, however, the common electrode 23A extends over all the pixels in the display region 70. An end of the common electrode 23A is disposed on a periphery of the display region 70 and connected with a peripheral common electric potential line 50 that provides a common electric potential Vcom.

A cross-sectional structure of the connecting portion is shown in FIG. 2. The peripheral common electric potential line 50 is formed of a layer same as a layer forming a display signal line 18 and is made of metal including aluminum or aluminum alloy or the like. The peripheral common electric potential line 50 is formed on an interlayer insulation film 16. The common electrode 23A is connected with the peripheral common electric potential line 50 through a contact hole CH7 that is formed in a planarization film 20 and the insulation film 22 formed on the peripheral common electric potential line 50. The peripheral common electric potential line 50 is connected with a terminal (not shown) on a TFT substrate 10. The common electric potential Vcom is supplied from an IC or the like outside the TFT substrate 10 through the terminal.

The liquid crystal display device according to the embodiment is provided with neither the auxiliary common electrode line 15 nor the pad electrode 19, which is provided in the conventional liquid crystal display device. As a result, the aperture ratio of the pixel is improved. Also the common electric potential Vcom is sufficiently supplied to the common electrode 23A through a low resistance, since the common electrode 23A extends over all the pixels in the display region 70 and its end is connected with the peripheral common electric potential line 50.

Figure 3:
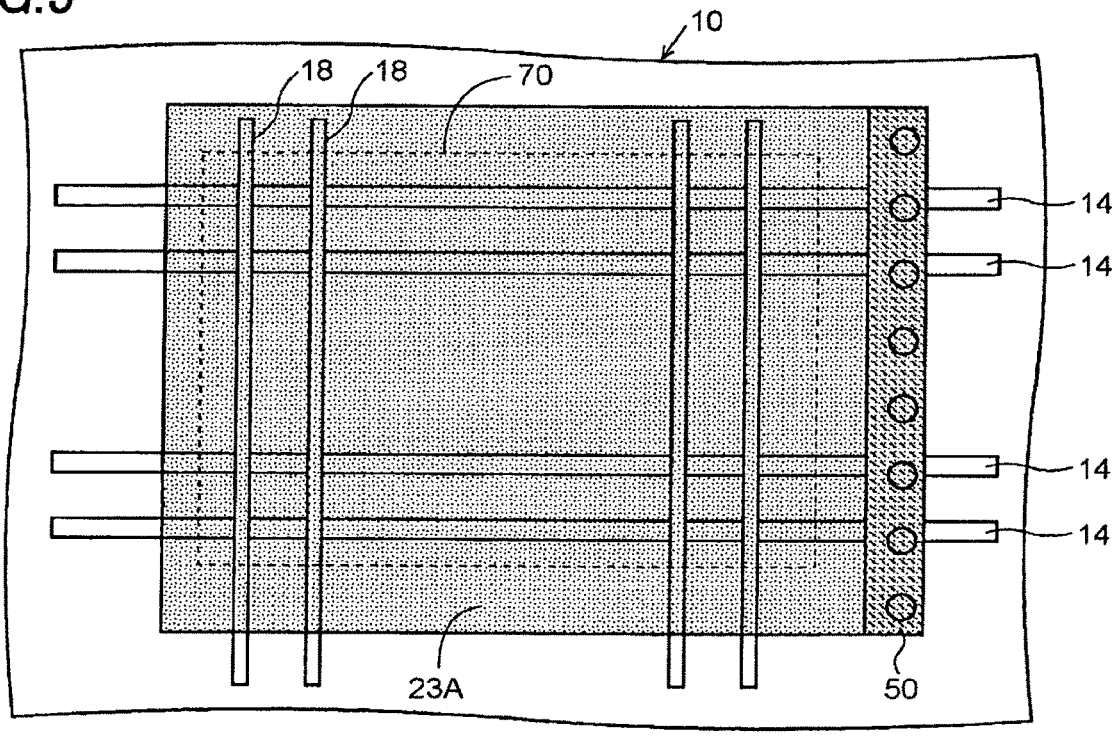
FIG. 3 shows a first layout of the liquid crystal display device according to the first embodiment of this invention.
Figure 4:
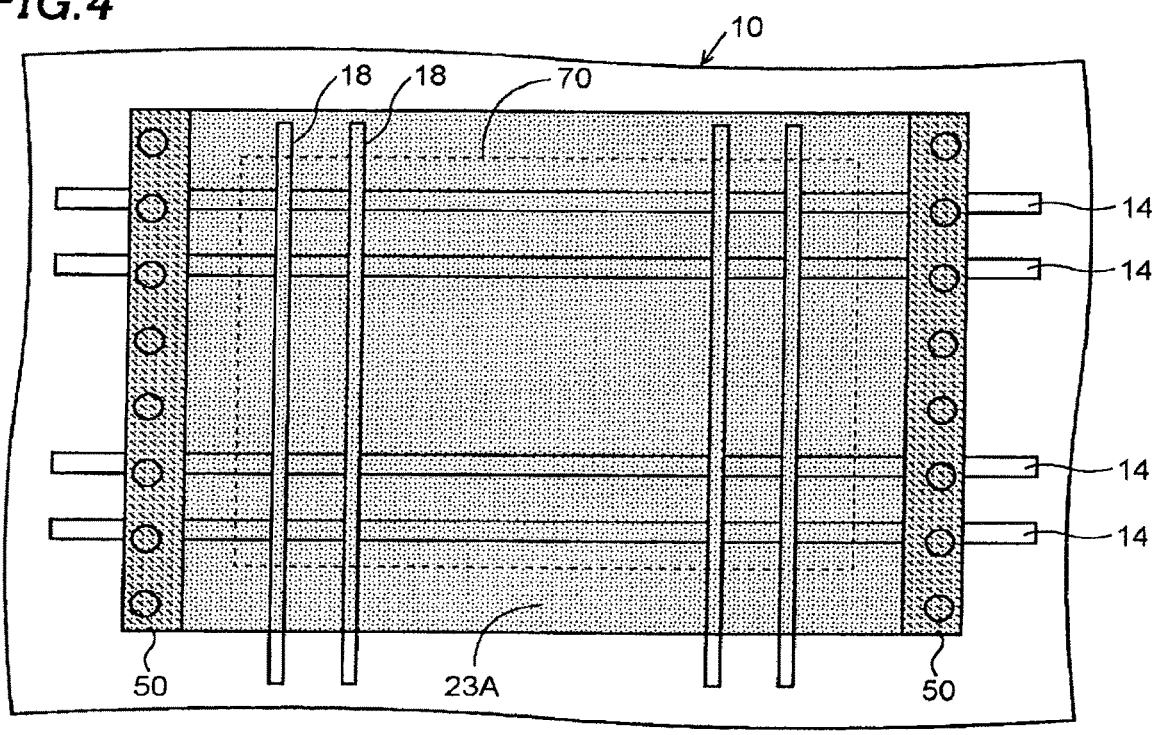
FIG. 4 shows a second layout of the liquid crystal display device according to the first embodiment of this invention.
Figure 5:
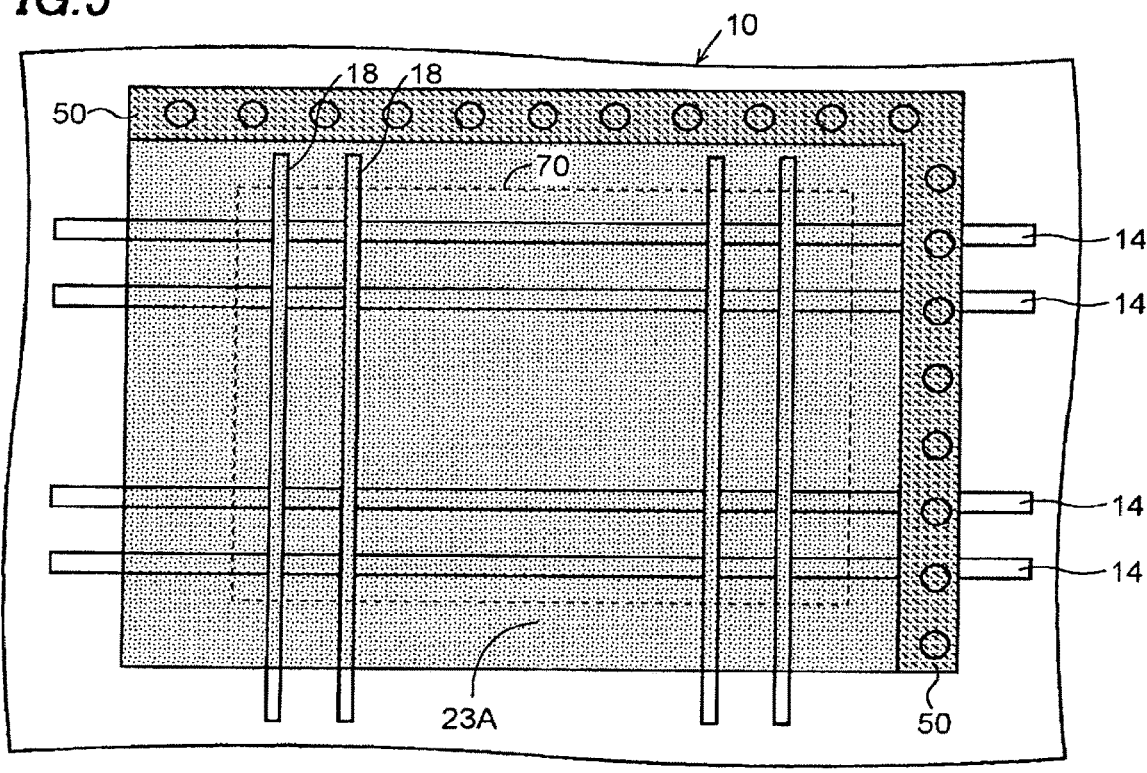
FIG. 5 shows a third layout of the liquid crystal display device according to the first embodiment of this invention.

The peripheral common electric potential line 50 is disposed on the periphery of the display region 70 along a side of the rectangular display region 70 in a first layout shown in FIG. 3. In order to supply the common electric potential Vcom to the common electrode 23A through even lower resistance, it is preferable that the peripheral common electric potential line 50 is disposed along each of two sides of the display region 70 facing each other and that the peripheral common electric potential line 50 on each side is connected with each end of the common electrode 23A, respectively, as in a second layout shown in FIG. 4. In this case, the peripheral common electric potential line 50 may be disposed along each of two adjacent sides of the display region 70, as in a third layout shown in FIG. 5.

Figure 6:
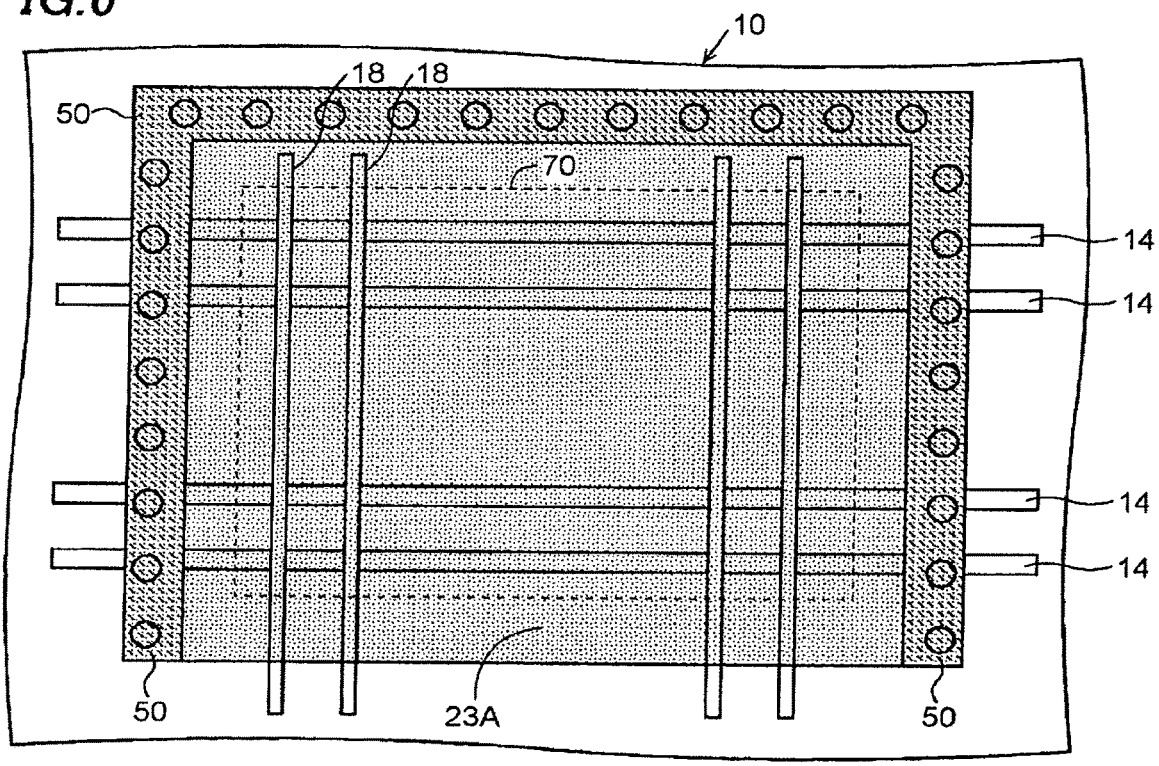
FIG. 6 shows a fourth layout of the liquid crystal display device according to the first embodiment of this invention.

In order to supply the common electric potential Vcom to the common electrode 23A through further lower resistance, it is preferable that the peripheral common electric potential line 50 is disposed along each of three sides of the display region 70 and that the peripheral common electric potential line 50 on each side is connected with each end of the common electrode 23A, as in a fourth layout shown in FIG. 6. Or it is preferable that the peripheral common electric potential line 50 is disposed along each of four sides of the display region 70 and that the peripheral common electric potential line 50 on each side is connected with each end of the common electrode 23A, as in a fifth layout shown in FIG. 7.

Figure 7:
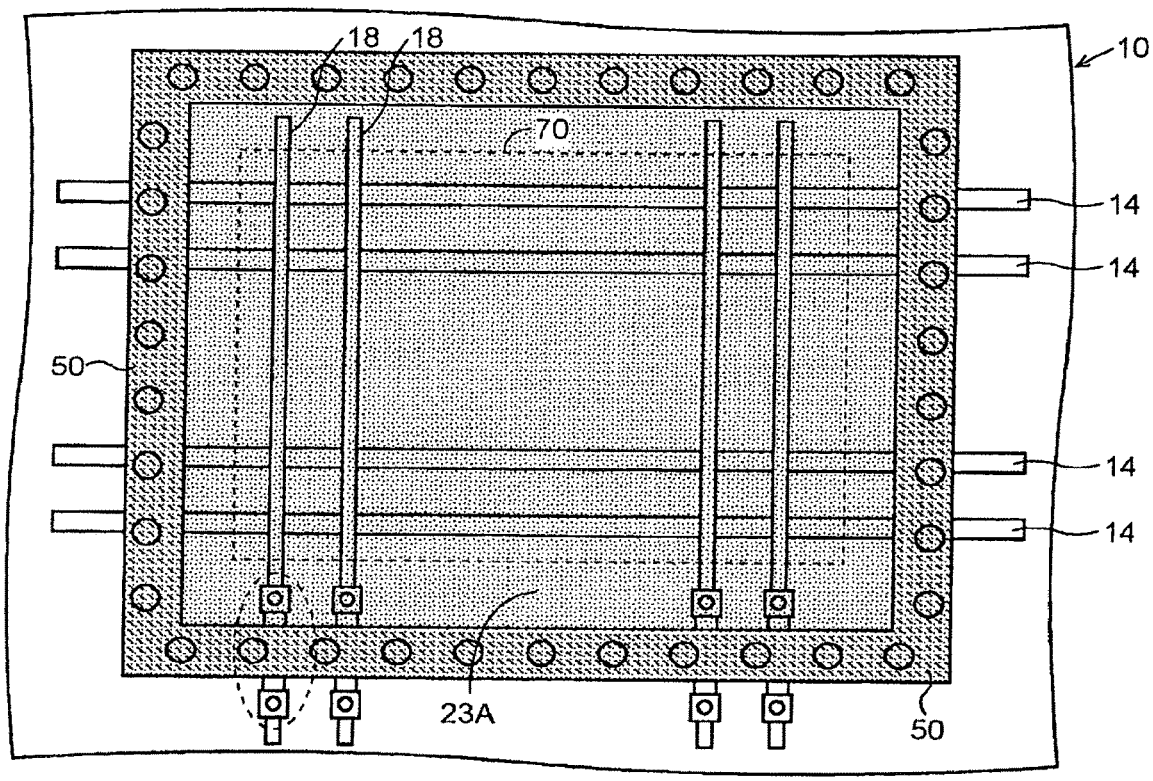
FIG. 7 shows a fifth layout of the liquid crystal display device according to the first embodiment of this invention.

However, with the fifth layout shown in FIG. 7, in which the display region 70 is surrounded by the peripheral common electric potential line 50, it is necessary that a gate line 14 and the display signal line 18 are drawn out across the peripheral common electric potential line 50. That is required in order to connect each of the gate line 14 and the display signal line 18 with a corresponding signal source, respectively.

When the peripheral common electric potential line 50 and the display signal line 18 are formed of the same layer, it is necessary that either the layer forming the peripheral common electric potential line 50 or the layer forming the display signal line 18 is partially modified to form a bridge at an intersection of the peripheral common electric potential line 50 and the display signal line 18 in order to avoid a short circuit, as shown in a portion surrounded by a dashed line in FIG. 7. For example, the display signal line 18 is modified into the same layer as the gate line 14 at the intersection. The gate line 14 crosses the peripheral common electric potential line 50 without causing a short circuit, because it is formed of the layer different from the layer forming the peripheral common electric potential line 50.

Figure 8:
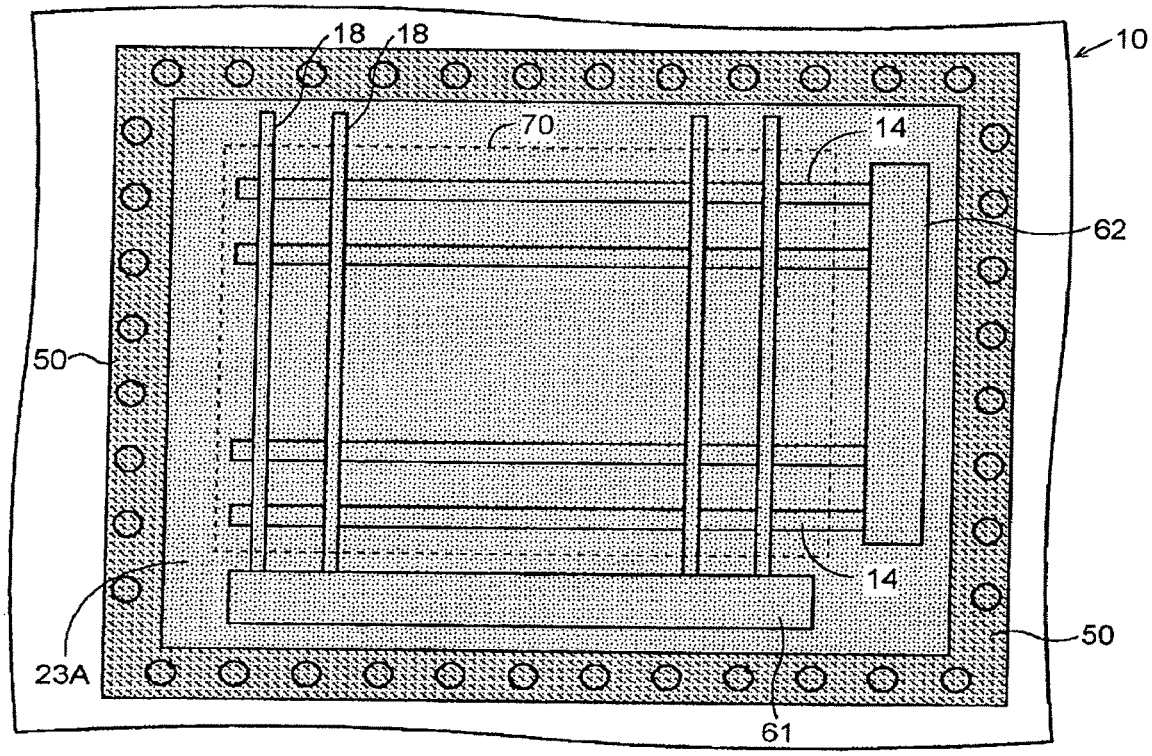
FIG. 8 shows a sixth layout of the liquid crystal display device according to the first embodiment of this invention.

The bridge and the crossing as described above can be avoided by disposing circuits serving as the signal sources in a region surrounded by the peripheral common electric potential line 50, as shown in FIG. 8. That is, a display signal line control circuit 61 that provides the display signal line 18 with the display signal and a gate line control circuit 62 that provides the gate line 14 with the gate signal are disposed in a region between the display region 70 and the peripheral common electric potential line 50.

Figure 9:
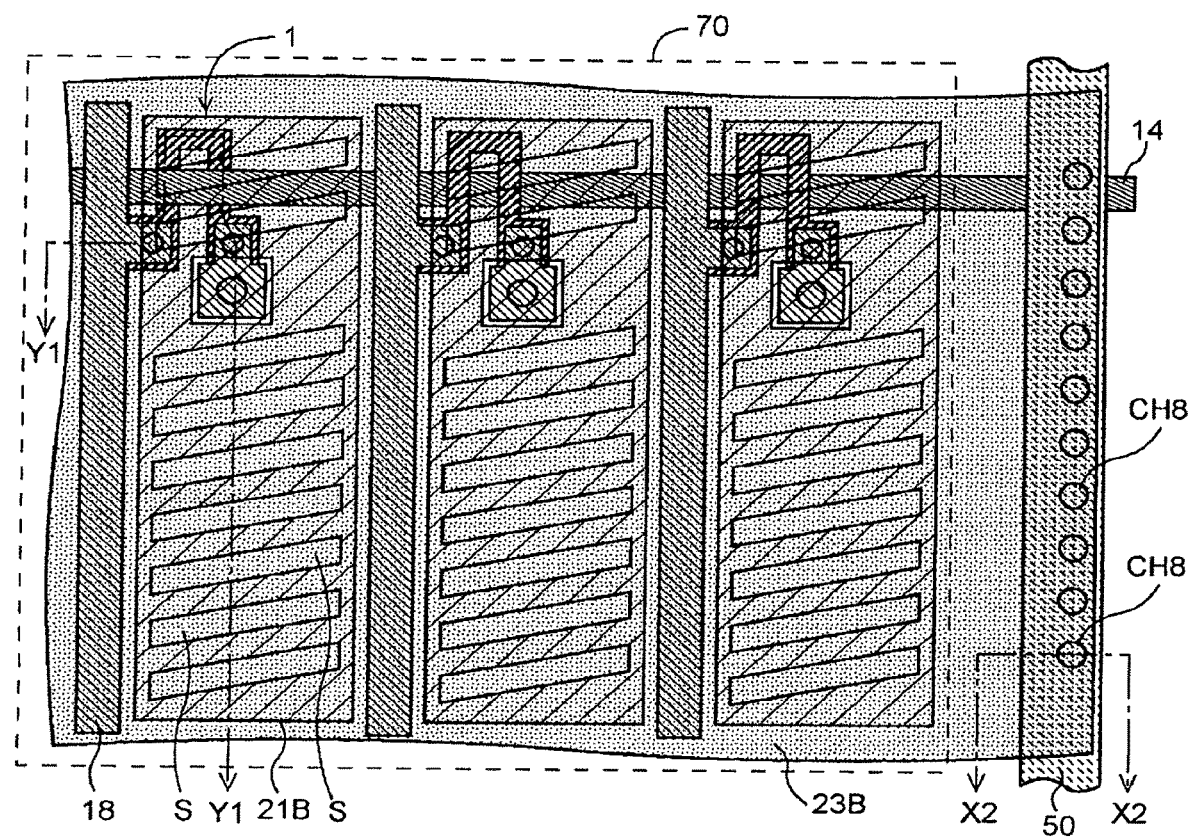
FIG. 9 is a plan view showing a portion of a display region in a liquid crystal display device according to a second embodiment of this invention.
Figure 10:
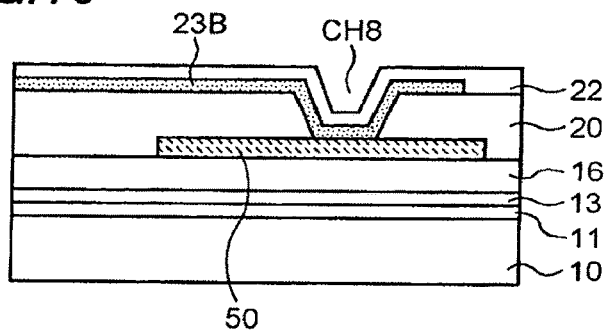
FIG. 10 is a cross-sectional view showing a section X2-X2 in FIG. 9.
Figure 11:
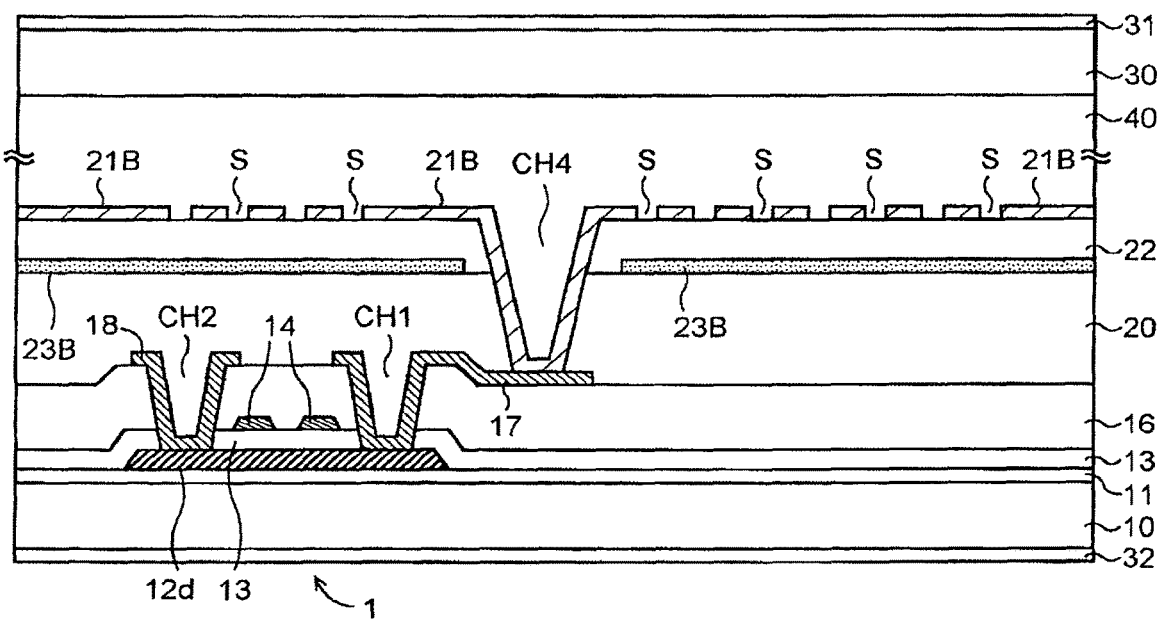
FIG. 11 is a cross-sectional view showing a section Y1-Y1 in FIG. 9.

A liquid crystal display device according to a second embodiment of this invention will be explained referring to the drawings. FIG. 9 is a plan view showing a portion of a display region in the liquid crystal display device. FIG. 10 is a cross-sectional view showing a section X2-X2 in FIG. 9. FIG. 11 is a cross-sectional view showing a section Y1-Y1 in FIG. 9. Although a large number of pixels are disposed in a matrix form in the display region in the actual liquid crystal display device, only three pixels are shown in the plan view.

A relationship between vertical locations of the pixel electrode 21 and the common electrode 23A in the liquid crystal display device according to the first embodiment is reversed in the liquid crystal display device according to the second embodiment. A common electrode 23B is formed of the first layer transparent electrode and a pixel electrode 21B is formed of the second layer transparent electrode above it interposing the insulation film 22 between them. The pixel electrode 21B in an upper layer is provided with a plurality of slits S.

With the pixels structured as described above, it is possible to obtain a liquid crystal display device having a wide viewing angle by generating lateral electric field between the pixel electrode 21B and the common electrode 23B and controlling the alignment direction of the liquid crystal molecules.

The pixel electrodes 21B are separated from each other and each of the pixel electrodes 21B is connected with a source electrode 17 of a TFT 1 in the same pixel. The common electrode 23B extends over all the pixels in the display region 70 as in the liquid crystal display device according to the first embodiment. An end of the common electrode 23B is disposed on a periphery of the display region 70 and connected with a peripheral common electric potential line 50 that provides a common electric potential Vcom.

A cross-sectional structure of the connecting portion is shown in FIG. 10. The peripheral common electric potential line 50 is formed of the same layer as a display signal line 18 and is made of metal including aluminum or aluminum alloy or the like. The peripheral common electric potential line 50 is formed on an interlayer insulation film 16. The common electrode 23B is connected with the peripheral common electric potential line 50 through a contact hole CH8 that is formed in a planarization film 20 and the insulation film 22 formed on the peripheral common electric potential line 50. The peripheral common electric potential line 50 is connected with a terminal (not shown) on a TFT substrate 10. The common electric potential Vcom is supplied from an IC or the like outside a TFT substrate 10 through the terminal.

Other structures are generally the same as those in the liquid crystal display device according to the first embodiment. That is, the layouts shown in FIG. 3 through FIG. 8 can be applied to a layout of the peripheral common electric potential line 50 and the common electrode 23B to obtain the same effects.

A liquid crystal display device according to a third embodiment of this invention will be explained referring to the drawings. The TFT 1 in the pixel in the liquid crystal display device according to the first and second embodiments is a polysilicon TFT that has an active layer made of polysilicon. Instead, an amorphous silicon TFT 1a (hereafter referred to as aSi-TFT 1a) that has an active layer made of amorphous silicon is used in the liquid crystal display device according to the third embodiment.

Figure 12:
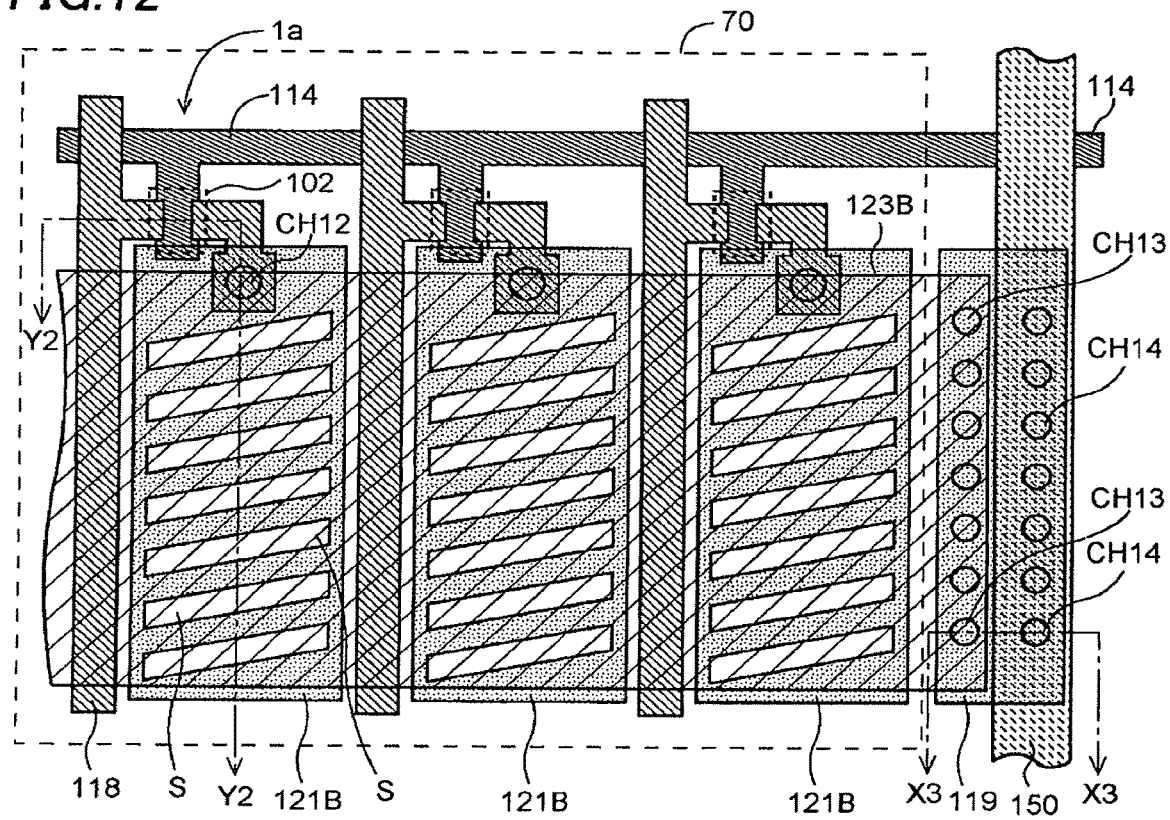
FIG. 12 is a plan view showing a portion of a display region in a liquid crystal display device according to a third embodiment of this invention.
Figure 13:
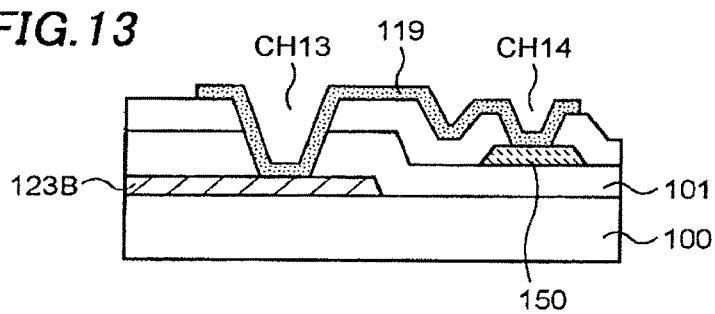
FIG. 13 is a cross-sectional view showing a section X3-X3 in FIG. 12.

FIG. 12 is a plan view showing a portion of a display region in the liquid crystal display device. FIG. 13 is a cross-sectional view showing a section X3-X3 in FIG. 12.

Figure 14:
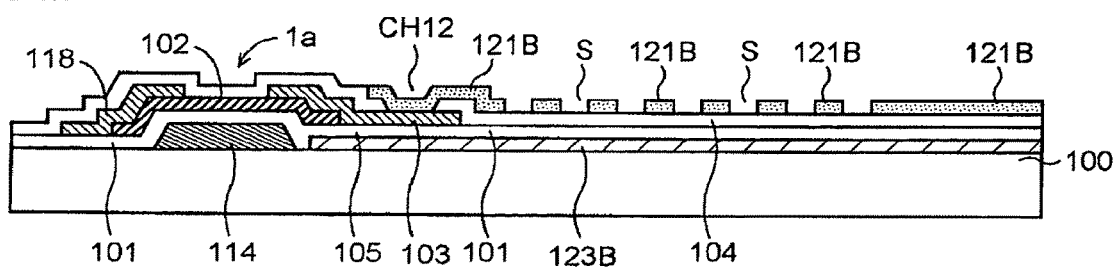
FIG. 14 is a cross-sectional view showing a section Y2-Y2 in FIG. 12.

FIG. 14 is a cross-sectional view showing a section Y2-Y2 in FIG. 12. Although a large number of pixels are disposed in a matrix form in the display region in the actual liquid crystal display device, only three pixels are shown in the plan view.

A gate line 114 of the aSi-TFT 1a is formed on a TFT substrate 100. The gate line 114 is formed of chromium, molybdenum or the like. A common electrode 123B extending over a plurality of pixels is formed in a shape of stripes in regions except for the gate line 114. The common electrode 123B is made of a first layer transparent electrode such as ITO. A gate insulation film 101 is formed to cover the gate line 114 and the common electrode 123B. An amorphous silicon layer 102 is formed on the gate insulation film 101 to cover the gate line 114. And a display signal line 118 (drain electrode) and a source electrode 103 are formed in contact with the amorphous silicon layer 102.

An interlayer insulation film 104 is formed over the entire surface and the interlayer insulation film 104 on the source electrode 103 is selectively etched to form a contact hole CH12. There is formed a pixel electrode 121B that is connected with the source electrode 103 through the contact hole CH12. The pixel electrode 121B is made of a second layer transparent electrode such as ITO and has a plurality of slits S. The pixel electrode 121B is formed above the common electrode 123B, interposing the gate insulation film 101 and the interlayer insulation film 104 between them.

With the pixels using the aSi-TFT 1a and structured as described above, it is possible to obtain a liquid crystal display device having a wide viewing angle by generating lateral electric field between the pixel electrode 121B and the common electrode 123B and controlling the alignment direction of the liquid crystal molecules.

An end of the common electrode 123B is disposed on a periphery of the display region 70 and connected with a peripheral common electric potential line 150 that provides a common electric potential Vcom. A cross-sectional structure of the connecting portion is shown in FIG. 13. The peripheral common electric potential line 150 is formed of the same layer as a display signal line 118 and is made of metal including aluminum or aluminum alloy or the like. The peripheral common electric potential line 150 is formed on the gate insulation film 101. The common electrode 123B is connected with the peripheral common electric potential line 150 through a connection wiring 119 that is made of the second layer transparent electrode and extending through a contact hole CH13 formed in the gate insulation film 101 and the interlayer insulation film 104 above the common electrode 123B and a contact hole CH14 formed in the interlayer insulation film 104 above the peripheral common electric potential line 150.

The peripheral common electric potential line 150 is connected with a terminal (not shown) on the TFT substrate 100. The common electric potential Vcom is supplied from an IC or the like outside the TFT substrate 100 through the terminal.

Other features such as that the counter substrate is disposed so as to face the TFT substrate 100 and that the liquid crystal is sealed-in between the TFT substrate 100 and the counter substrate are the same as in the first and second embodiments, and detailed explanations are omitted.

Neither the auxiliary common electrode line 15 nor the pad electrode 19 is provided in the liquid crystal display device according to the third embodiment, as in the liquid crystal display devices according to the first and second embodiments. As a result, the aperture ratio of the pixel is improved. Also the common electric potential Vcom is sufficiently supplied to the common electrode 123B through a low resistance, since the common electrode 123B extends over all the pixels in the display region 70 and its end is connected with the peripheral common electric potential line 150. Also, the layouts shown in FIG. 3 through FIG. 8 can be applied to a layout of the peripheral common electric potential line 150 and the common electrode 123B to obtain the same effects.

Figure 15:
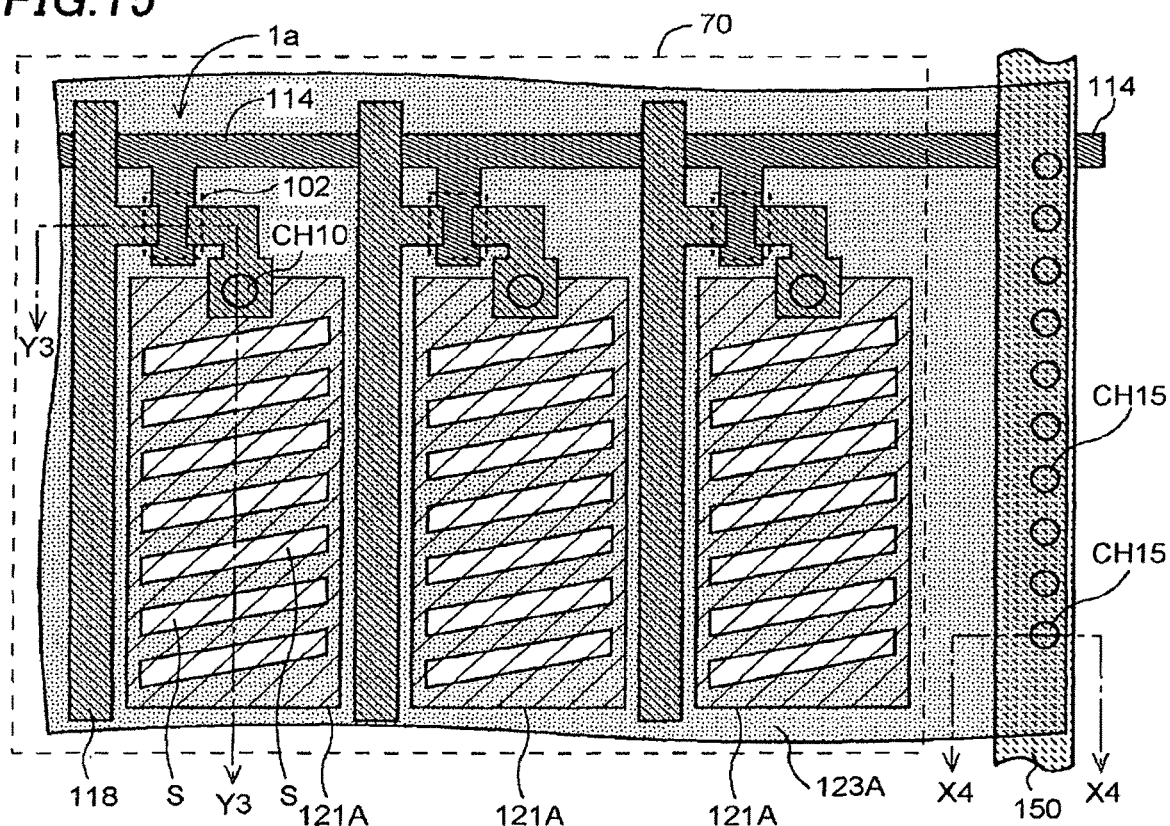
FIG. 15 is a plan view showing a portion of a display region in a liquid crystal display device according to a fourth embodiment of this invention.
Figure 16:
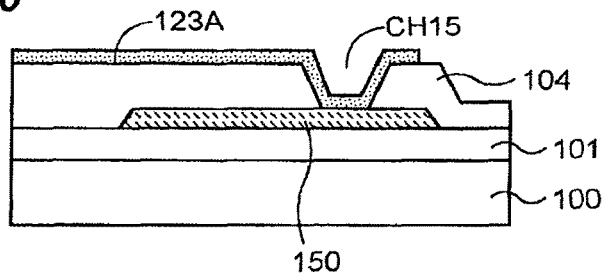
FIG. 16 is a cross-sectional view showing a section X4-X4 in FIG. 15.
Figure 17:
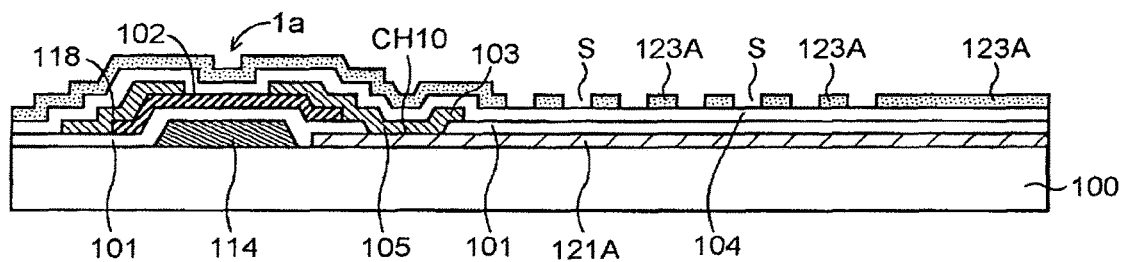
FIG. 17 is a cross-sectional view showing a section Y3-Y3 in FIG. 15.
Figure 18A:
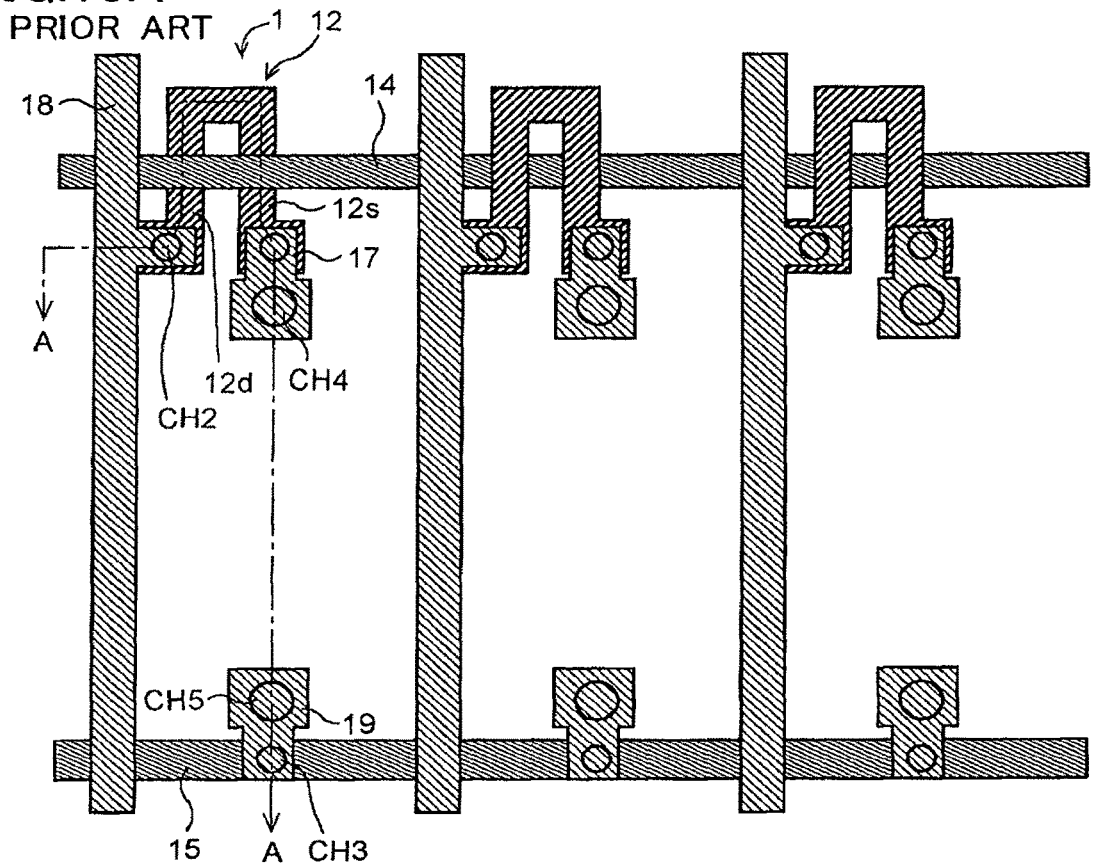
FIGS. 18A and 18B are for explanation of a structure and a manufacturing method of a liquid crystal display device according to a conventional art.
Figure 18B:
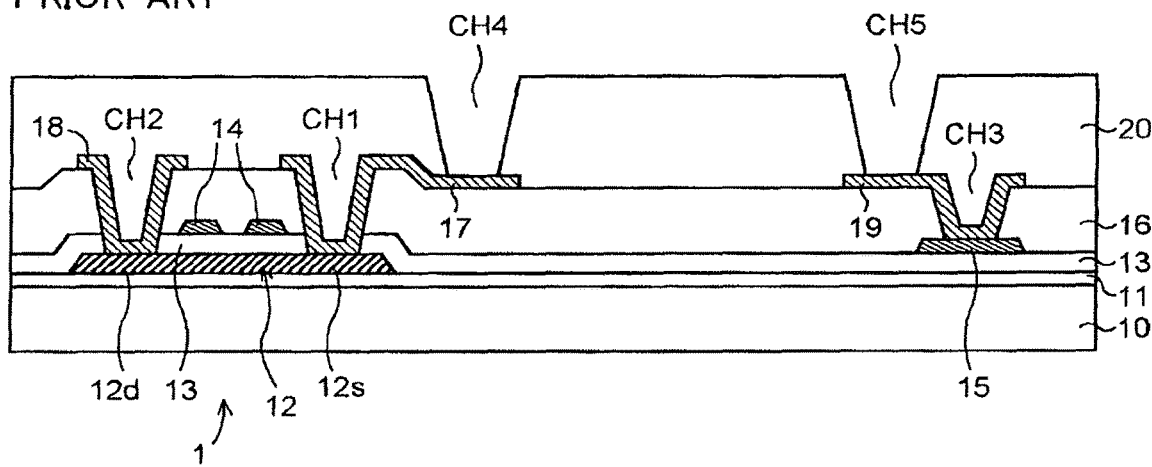
Figure 19A:
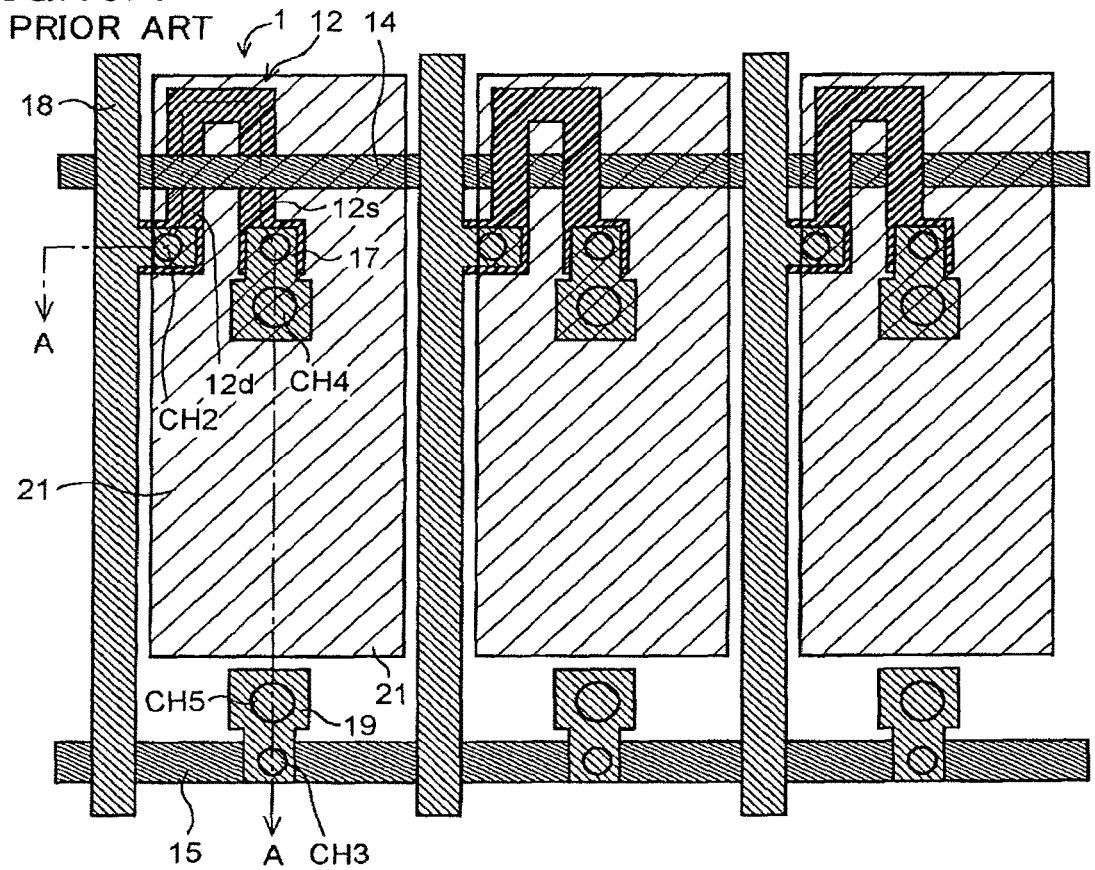
FIGS. 19A and 19B are for explanation of the structure and the manufacturing method of the liquid crystal display device according to the conventional art.
Figure 19B:
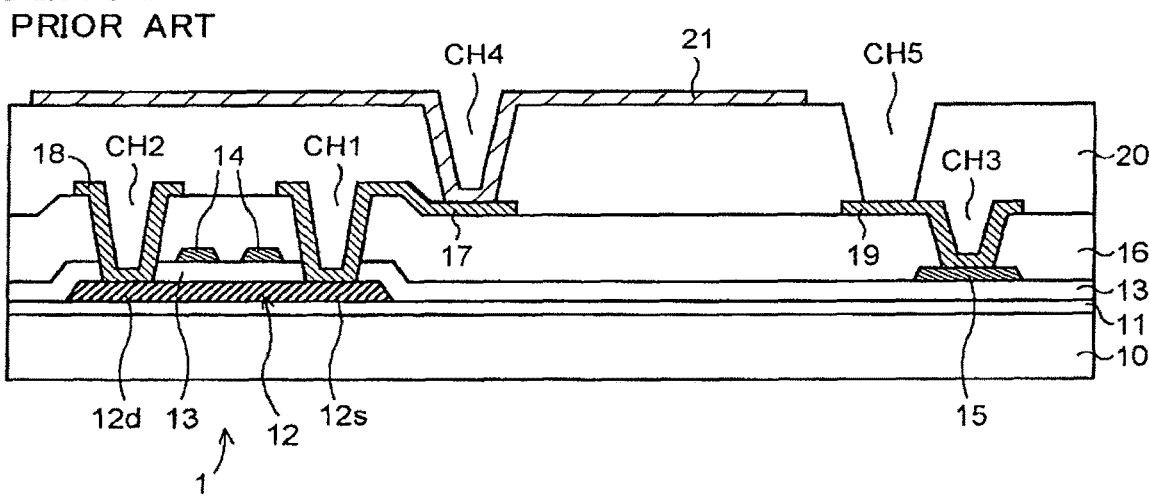

A liquid crystal display device according to a fourth embodiment of this invention will be explained referring to the drawings. FIG. 15 is a plan view showing a portion of a display region in the liquid crystal display device. FIG. 16 is a cross-sectional view showing a section X4-X4 in FIG. 15. FIG. 16 is a cross-sectional view showing a section Y3-Y3 in FIG. 15. Although a large number of pixels are disposed in a matrix form in the display region in the actual liquid crystal display device, only three pixels are shown in the plan view.

A relationship between vertical locations of the pixel electrode 121B and the common electrode 123B in the liquid crystal display device according to the third embodiment is reversed in the liquid crystal display device according to the fourth embodiment. A pixel electrode 121A is formed of a first layer transparent electrode and a common electrode 123A is formed of a second layer transparent electrode above it interposing a gate insulation film 101 and an interlayer insulation film 104 between them in the liquid crystal display device according to the fourth embodiment. The common electrode 123A in an upper layer is provided with a plurality of slits S.

An end of the common electrode 123A is disposed on a periphery of the display region 70 and connected with a peripheral common electric potential line 150 that provides a common electric potential Vcom. A cross-sectional structure of the connecting portion is shown in FIG. 16. The peripheral common electric potential line 150 is formed of the same layer as a display signal line 118 and is made of metal including aluminum or aluminum alloy or the like. The peripheral common electric potential line 150 is formed on the gate insulation film 101. The common electrode 123A is connected with the peripheral common electric potential line 150 through a contact hole CH15 formed in the interlayer insulation film 104 above the peripheral common electric potential line 150. Other structures are the same as those in the liquid crystal display device according to the third embodiment.

Note that the slits S may extend over a plurality of pixels although the slits S in the common electrode 23A or 123A are formed within a single pixel in the liquid crystal display devices according to the first through fourth embodiments. Also, the pixel electrodes 21B and 121B may have a comb-shaped slit S that is open at one end.

With the liquid crystal display devices according to the embodiments of this invention, the auxiliary common electrode line in the display region can be removed to improve the aperture ratio of the pixel, since the common electrode is provided with the common electric potential through the peripheral common electric potential line disposed on the periphery of the display region. In addition, the common electrode can be sufficiently provided with the common electric potential through the low resistance, because the common electrode is disposed to extend over the plurality of pixels and connected with the peripheral common electric potential line.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A display device comprising:
a first substrate;
a second substrate; and
a liquid crystal layer disposed between the first substrate and the second substrate,
the first substrate comprising:
a plurality of pixels arranged in a display portion, wherein each of the pixels includes a pixel electrode;
a plurality of thin film transistors, each electrically connected to a corresponding one of the pixel electrodes;
a plurality of signal lines electrically connected to the thin film transistors;
a common electrode opposed to the pixel electrodes, the liquid crystal layer being controlled by an electric field between the pixel electrodes and the common electrode;
an insulating film interposed between the pixel electrodes and the common electrode;
a planarization film disposed under the common electrode;
a common line that is a metal line and that is connected to the common electrode through a plurality of contact holes in the planarization film, the common line being disposed between the first substrate and the insulating film, outside the display portion along at least one side of the display portion, and the common line intersecting the signal lines, in plan view;
a plurality of gate lines electrically connected to the thin film transistors; and
a bridge that is disposed at an intersection of the common line and one of the signal lines, the bridge being formed of a same layer as the gate lines,
wherein the common electrode overlaps the entire area of the display portion, and
wherein the contact holes are arranged in a first direction along the common line in such a manner that a distance between the contact holes in the first direction is less than a length of each pixel in the first direction.

2. The display device according to claim 1, wherein the common line is intersected with the gate lines in plan view.

3. The display device according to claim 2, further comprising:
a signal line control circuit configured to provide a display signal to each of the signal lines; and
a gate line control circuit configured to provide a gate signal to each of the gate lines,
wherein the common line is disposed between the display portion and the signal line control circuit, and is disposed between the display portion and the gate line control circuit.

4. The display device according to claim 1, wherein the common line is formed of a same layer as the signal lines.

5. The display device according to claim 1, wherein the common electrode is closer to the liquid crystal layer than the common line and the signal lines in a sectional view.

6. The display device according to claim 1, wherein the first substrate comprises the entire portion of the common line in plan view.

7. The display device according to claim 1, wherein the display portion has a rectangular shape.

8. The display device according to claim 1, wherein the pixel electrode is above the common electrode.

9. The display device according to claim 1,
wherein the common line is disposed in an area where the pixels are not formed in plan view.

10. The display device according to claim 1,
wherein, in plan view, the common line and the contact holes are disposed outside the display portion such that the common line does not overlap the pixel electrodes arranged in the display portion.

11. The display device according to claim 1, wherein the contact holes are arranged in the first direction that is an extending direction of the signal lines in such a manner that the distance between the contact holes in the first direction is less than the length of each pixel in the first direction.

12. The display device according to claim 1, wherein the gate lines include molybdenum.

13. The display device according to claim 1, wherein the signal lines include aluminum.

14. The display device according to claim 1, wherein the pixel electrode and the common electrode include indium.

15. The display device according to claim 1, wherein each of the thin film transistors is a bottom gate type transistor.

16. The display device according to claim 1, wherein a plurality of contact portions of the signal lines and the bridges are arrayed in an extending direction of the gate lines.

17. The display device according to claim 1, further comprising a plurality of the bridges at the intersections of the common line and the signal lines.

18. The display device according to claim 1, wherein
a plurality of the bridges are disposed at respective intersections of the common line and the respective signal lines, each of the signal lines coupling the thin film transistors, each coupling the corresponding one of the pixel electrodes, and
each of the signal lines is partially modified into the same layer as the gate lines to form the bridges at the respective intersections.

19. The display device according to claim 1, wherein
each of the signal lines is connected to the thin film transistors via one of a source and a drain of the respective thin film transistors, and
the other of the source and the drain of the respective thin film transistors is coupled to a corresponding pixel electrode via a connecting wire that is disposed in a same layer as the signal lines.

20. The display device according to claim 1, wherein at least two contact holes are arranged per the length of each pixel in the first direction.

* * * * *